United States Patent [19]

Ciuciu et al.

[11] Patent Number: 4,689,791
[45] Date of Patent: Aug. 25, 1987

[54] DEVICE FOR TRANSLATING A TEST SEQUENCE TO A BURN-IN SEQUENCE FOR A LOGIC CIRCUIT AND/OR A DIGITAL CIRCUIT, A METHOD FOR BURN-IN OPERATION OF A LOGIC CIRCUIT AND/OR A DIGITAL CIRCUIT

[75] Inventors: Eric Ciuciu, Yerres; Jean Imbert, Ste Genevieve des Bois; Jacques Flandrois, Maurepas, all of France

[73] Assignee: Thomson CSF, Paris, France

[21] Appl. No.: 773,618

[22] Filed: Sep. 9, 1985

[51] Int. Cl.⁴ ............................................. G01R 31/28
[52] U.S. Cl. ....................................... 371/27; 371/20; 324/73 R
[58] Field of Search ................. 371/20, 27; 324/73 R, 324/73 AT

[56] References Cited

U.S. PATENT DOCUMENTS

| | | | |
|---|---|---|---|
| 4,379,259 | 4/1983 | Varadi | 371/21 X |
| 4,388,719 | 6/1983 | Soltysik | 371/27 |
| 4,495,622 | 1/1985 | Charruau | 371/27 X |

*Primary Examiner*—Jerry Smith
*Assistant Examiner*—Robert W. Beausoliel, Jr.
*Attorney, Agent, or Firm*—Oblon, Fisher, Spivak, McClelland, & Maier

[57] ABSTRACT

In order to translate a test sequence into a sequence for burn-in operation of integrated logic circuits and digital circuits, the invention provides a method and a device for automatic translation of a test truth-table into a burn-in truth-table. In addition to the reduction in cost achieved by automatic generation of test sequence, a test performed after burn-in operation of a circuit permits reliable detection of a circuit fault since the same type of sequence is adopted both for burn-in and for testing.

5 Claims, 6 Drawing Figures

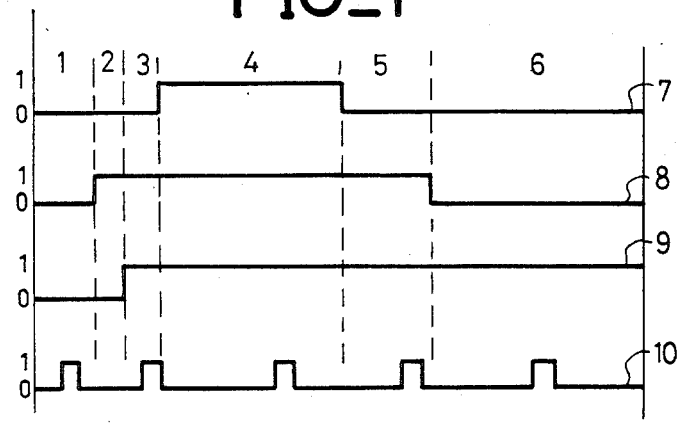
FIG_1
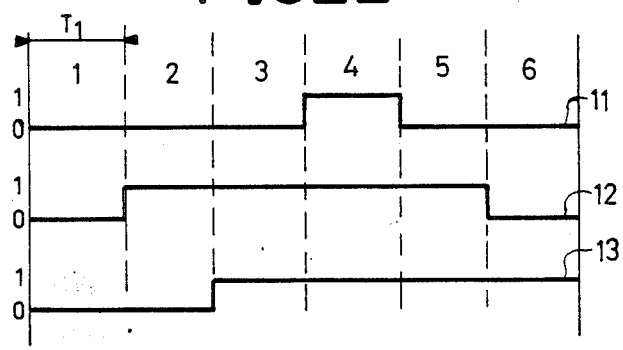
FIG_2
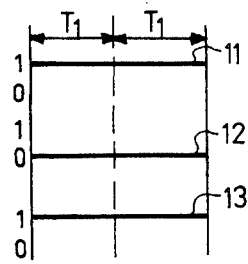
FIG_3-a
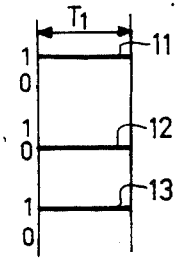
FIG_3-b

FIG_4
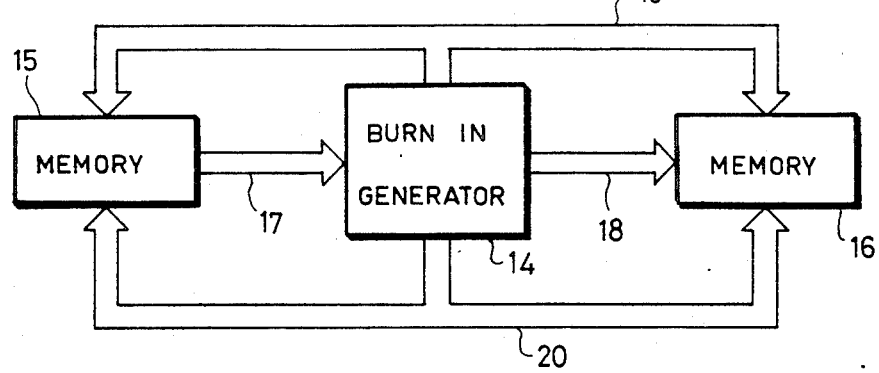
FIG_5
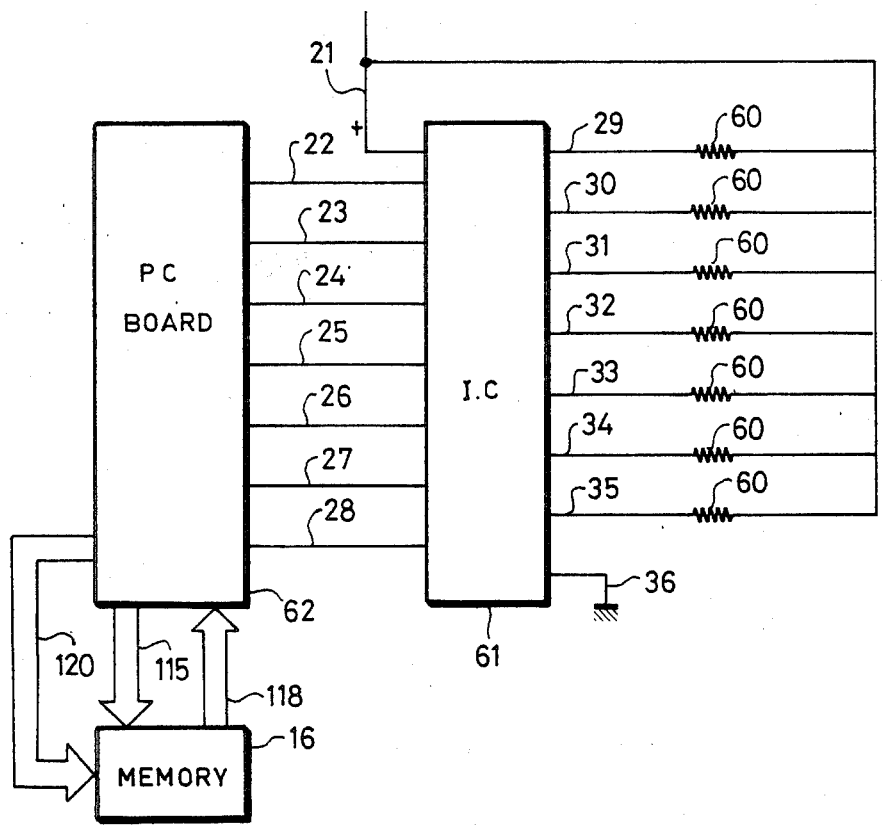

DEVICE FOR TRANSLATING A TEST SEQUENCE TO A BURN-IN SEQUENCE FOR A LOGIC CIRCUIT AND/OR A DIGITAL CIRCUIT, A METHOD FOR BURN-IN OPERATION OF A LOGIC CIRCUIT AND/OR A DIGITAL CIRCUIT

BACKGROUND OF THE INVENTION

1. Field of the Invention

The present invention is primarily directed to a device for translating a test sequence into a burn-in sequence for a logic circuit and/or a digital circuit, a method for burn-in operation of a logic circuit and/or a digital circuit and a device for burn-in operation of a logic circuit and/or a digital circuit.

2. Description of the Prior Art

As a result of the improvements achieved in the performances of logic circuits and digital circuits, the potential applications of such circuits are constantly increasing. Certain fields such as aeronautics, for example, require total reliability of these circuits. It has thus become necessary to test logic circuits and digital circuits prior to initial use. In order to provide enhanced reliability of said circuits and to ensure not only that the circuit operates after it has been fabricated but also that it is not liable to fail during the first hours of operation, it is therefore found necessary to perform operations known as "burn-in" sequences. "Burn-in" consists, for example, in operating the logic circuit and/or digital circuit over a period of 168 hours at 125° C. During this period, the circuit is caused to perform the maximum number of functions which it is expected to carry out during use.

It is a known practice to generate burn-in sequences for logic and/or digital circuits by hand. This method, however, is becoming less and less efficacious and increasingly costly as the logic and/or digital circuit to be tested becomes more complex.

The device in accordance with the invention makes it possible to generate from a test sequence a burn-in sequence for a logic circuit and/or a digital circuit. This permits a saving of time and a reduction in cost of burn-in operation of these circuits. Furthermore, by employing the same type of sequence both for burn-in and for testing, a test performed after burn-in operation of a circuit would increase the probability of detection of a fault in said circuit.

SUMMARY OF THE INVENTION

The primary object of the invention is to provide a device for translating a test sequence into a burn-in sequence for digital circuits, the device being distinguished by the fact that it retains the number of transitions of the test sequence in the burn-in sequence.

BRIEF DESCRIPTION OF THE DRAWINGS

Other features of the invention will be more apparent upon consideration of the following description and accompanying drawings, wherein:

FIG. 1 illustrates a test sequence performed on a logic circuit and/or a digital circuit;

FIG. 2 illustrates a burn-in sequence performed on a logic circuit and/or a digital circuit and generated by the system in accordance with the invention from the test sequence illustrated in FIG. 1;

FIGS. 3a and 3b illustrate the compression of two identical and successive burn-in steps into a single step;

FIG. 4 illustrates a device for generating a burn-in sequence in accordance with the invention;

FIG. 5 is a diagram of a circuit burn-in device in accordance with the invention.

DETAILED DESCRIPTION OF THE INVENTION

In FIG. 1, there is shown one example of a test chronogram of a logic and/or digital circuit. Curves 7, 8 and 9 correspond to three inputs of the circuit. Curve 10 represents the strobe pulse waveform. The signals 7, 8 and 9 applied to the different inputs of the circuit correspond to pre-established testing truth-tables.

In FIG. 2, there are shown the test signals 11, and 13 to be applied for burn-in operation of the circuit, these signals being the translation respectively of the circuit test signals 7, 8 and 9. In the example of signals 11, 12 and 13 for three selected inputs, the chronogram is composed of six periods $T_1$ of identical duration. In order to translate the test truth-tables into burn-in signals for static circuits, it is only necessary to maintain the number of transitions on the different inputs of the circuit. On the other hand, in the case of burn-in of dynamic MOS circuits, the translation must also take into account the minimum time of refreshment of these circuits.

FIG. 3a shows one example of two successive periods $T_1$ for which the values of the signals 11, 12 and 13 are identical. There will advantageously appear during the burn-in sequence a single period $T_1$ corresponding to these values which are illustrated in FIG. 3b.

FIG. 4 shows a device for generating a burn-in sequence from test sequences for integrated circuits. The devices comprise a burn-in sequence generator 14 and two memories 15 and 16. The burn-in sequence generator 14 is a computer containing a program for translating test truth-tables into burn-in truth-tables. By way of example, the memories 15 and 16 are magnetic disks. The memory 15 is connected to the burn-in sequence generator 14 via a data bus 17. The burn-in sequence generator 14 is connected to the memory 16 through a data bus 18. The memories 15 and 16 are connected to the burn-in sequence generator 14 through a control bus 19 and an address bus 20. In the case of each value combination of the signals 7, 8 and 9 numbered in FIG. 1 from 1 to 6, the burn-in sequence generator 14 reads the values of these signals from the memory 15. The burn-in sequence generator performs the signal-shaping operation and produces a circuit burn-in signal which is transmitted by the bus 18 in order to be stored in the memory 16. This process is carried on throughout the test sequence.

In FIG. 5, there is shown a burn-in device which makes use of burn-in sequences in accordance with the invention. The burn-in device comprises a so-called driver card 62, the circuits 61 to be subjected to a burn-in operation, as well as the memory 16. The driver card 62 is connected to the memory 16 through a data bus 115, a control bus 118 and an address bus 120. The circuit 61 has a terminal 36 connected to ground as well as a power supply terminal 21, for example for direct-current supply at +5 volts. In addition, the example of the circuit illustrated in FIG. 5 has inputs 22 to 28 and outputs 29 to 35. The inputs 22 to 28 are connected to the driver card 62. The outputs 29 to 35 are connected through resistors 60 to the terminal 21 of the circuit 61. The driver card 62 comprises signal-shaping devices connected to current amplifiers which are in turn connected to the inputs 22 to 28 of the circuit 61. The current amplifiers and the signal-shaping devices permit excitation of the inputs of the circuit 61. The driver card 62 also comprises address counters. At each period $T_1$ of the test sequence, the driver card 62 reads via the buses 115, 119 and 120 the value stored in memory 16 and corresponding to the values of the signals 11, 12 and 13 of FIG. 2. These signals are generated by the signal-shaping circuits and the current amplifiers. By way of example, the memory 16 is a programmable read-only memory (PROM).

The device in accordance with the invention is primarily applicable to burn-in operation of digital integrated circuits.

What is claimed is:

1. A device for translating a predetermined test sequence for a logic circuit into a burn-in sequence to be applied to said logic circuit during a burn-in operation, wherein said test sequence includes a predetermined number of transitions in test signals to be applied to inputs of said logic circuit in accordance with a pre-established test truth table, comprising:

first memory means for storing said test sequence;
   generator means coupled to said first memory means for translating said pre-established test truth table into a burn-in truth table corresponding to burn-in signals to be applied to said logic circuit during said burn-in operation, said burn-in signals having a number of transitions equal to said predetermined number of transitions in said test signals; and
   second memory means coupled to said generator means for storing said burn-in sequence.

2. A device according to claim 1, wherein said generator means causes a single burn-in sequence period to correspond to two successive test sequence periods of identical value.

3. A device according to claim 1, wherein the logic circuit is a static circuit.

4. A device according to claim 1, wherein the logic circuit is a dynamic MOS circuit and the translated burn-in sequence takes into account the refreshment time of said circuit.

5. A method for burn-in operation of logic circuits, comprising:

producing a test sequence in the form of test signals having a predetermined number of transitions for application to said logic circuit in accordance with a pre-established test truth table;
   storing said test sequence in a first memory;
   translating the test sequence stored in said first memory into a burn-in sequence in the form of burn-in signals to be applied to said logic circuit during a burn-in operation, said burn-in signals having a number of transitions equal to the predetermined number of transitions in said test signals;
   storing said burn-in sequence in a second memory;
   performing a burn-in operation in which said burn-in sequence is retrieved from said second memory and said burn-in signals are applied to said inputs of said logic circuits and the outputs of said logic circuits are monitored; and
   testing said logic circuit by applying said test sequence to inputs of said logic circuit and monitoring the outputs of said logic circuit.

* * * * *

UNITED STATES PATENT AND TRADEMARK OFFICE
CERTIFICATE OF CORRECTION

PATENT NO. : 4,689,791
DATED : August 25, 1987
INVENTOR(S) : Eric Ciuciu, et al

It is certified that error appears in the above-identified patent and that said Letters Patent is hereby corrected as shown below:

ON THE TITLE PAGE:

The Priority information was omitted from the Letters Patent. Should read as follows:

- Sept. 11, 1984 [FRANCE] ............. 84 13 938 -

Signed and Sealed this

Twenty-second Day of December, 1987

*Attest:*

DONALD J. QUIGG

*Attesting Officer*     *Commissioner of Patents and Trademarks*